(12) United States Patent
Kim et al.

(10) Patent No.: US 10,714,708 B2
(45) Date of Patent: Jul. 14, 2020

(54) DISPLAY AND METHOD OF MANUFACTURING THE SAME

(71) Applicant: SAMSUNG DISPLAY CO., LTD., Yongin-si, Gyeonggi-do (KR)

(72) Inventors: Sooyoun Kim, Yongin-si (KR); Seunghun Kim, Yongin-si (KR); Moonwon Chang, Yongin-si (KR); Wooyong Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/256,755

(22) Filed: Jan. 24, 2019

(65) Prior Publication Data

US 2019/0237703 A1    Aug. 1, 2019

(30) Foreign Application Priority Data

Feb. 1, 2018    (KR) .................. 10-2018-0013080

(51) Int. Cl.
*H01L 51/52* (2006.01)
*H01L 27/32* (2006.01)
*H01L 51/50* (2006.01)

(52) U.S. Cl.
CPC ...... *H01L 51/5256* (2013.01); *H01L 27/3246* (2013.01); *H01L 51/5012* (2013.01); *H01L 2227/323* (2013.01); *H01L 2251/5338* (2013.01)

(58) Field of Classification Search
CPC ............ H01L 51/5256; H01L 51/5212; H01L 27/3246; H01L 2227/323; H01L 2251/5338
USPC ............. 257/40, 59, 72; 438/48, 82, 99, 128
See application file for complete search history.

(56) References Cited

U.S. PATENT DOCUMENTS

| | | | |
|---|---|---|---|
| 2016/0299611 A1* | 10/2016 | Park | H01L 27/323 |
| 2017/0050914 A1 | 2/2017 | Malofsky et al. | |
| 2017/0051184 A1 | 2/2017 | Yoo et al. | |
| 2018/0061904 A1* | 3/2018 | Shim et al. | H01L 51/102 |

FOREIGN PATENT DOCUMENTS

| | | |
|---|---|---|
| KR | 10-2014-0016474 A | 2/2014 |
| KR | 10-2016-0006520 A | 1/2016 |
| KR | 10-2016-0149599 A | 12/2016 |

* cited by examiner

*Primary Examiner* — Thinh T Nguyen
(74) *Attorney, Agent, or Firm* — Lewis Roca Rothgerber Christie LLP (57) ABSTRACT

An organic light-emitting display apparatus and a method of manufacturing the same are provided. An organic light-emitting display apparatus includes: a substrate including an emission region and a non-emission region surrounding the emission region; a display device in the emission region of the substrate; an insulating layer in the non-emission region and including a hole having a lower portion having a first width and an upper portion having a second width less than the first width; and an encapsulation member covering the display device and the insulating layer and filling an inside of the hole.

15 Claims, 13 Drawing Sheets

DISPLAY AND METHOD OF MANUFACTURING THE SAME

CROSS-REFERENCE TO RELATED APPLICATION

This application claims priority to and the benefit of Korean Patent Application No. 10-2018-0013080, filed on Feb. 1, 2018 in the Korean Intellectual Property Office, the entire disclosure of which is incorporated herein by reference.

BACKGROUND

1. Field

Aspects of embodiments relate to an organic light-emitting display apparatus and a method of manufacturing the same.

2. Description of the Related Art

An organic light-emitting display apparatus includes a hole injection electrode, an electron injection electrode, and an organic light-emitting device including an organic emissive layer between the hole injection electrode and the electron injection electrode. The organic light-emitting display apparatus is a self-emissive display apparatus that generates light when excitons, which are generated when holes injected from the hole injection electrode and electrons injected from the electron injection electrode are combined in the organic emissive layer, drop from an excited state to a ground state.

Since the organic light-emitting display apparatus is self-emissive and does not require a separate light source, the organic light-emitting display apparatus may operate with a low voltage and may be thin and lightweight.

SUMMARY

According to an aspect of one or more embodiments, in a display apparatus, release of an encapsulation member occurring at an interface between a display and the encapsulation member may be prevented or substantially prevented. According to another aspect of one or more embodiments, a method of manufacturing a display apparatus, in which release of an encapsulation member occurring at an interface between a display and the encapsulation member may be prevented or substantially prevented, is provided. However, the above aspects are merely examples, and the scope of the present disclosure is not limited thereto.

Additional aspects will be set forth, in part, in the description which follows and, in part, will be apparent from the description, or may be learned by practice of the presented embodiments.

According to one or more embodiments, an organic light-emitting display apparatus includes: a substrate including an emission region and a non-emission region surrounding the emission region; a display device in the emission region of the substrate; an insulating layer in the non-emission region and including a hole having a lower portion having a first width and an upper portion having a second width less than the first width; and an encapsulation member covering the display device and the insulating layer and filling an inside of the hole.

In all directions from a center of the hole, a distance from the center of the hole to a side surface of the lower portion of the hole may be greater than a distance from the center of the hole to a side surface of the upper portion of the hole.

A distance from a side surface of the lower portion of the hole to a side surface of the upper portion of the hole may be less than or equal to 1500 Å.

A height of the lower portion of the hole may be less than a thickness of the insulating layer.

The display device may include: a first electrode; a second electrode facing the first electrode; and an emissive layer between the first electrode and the second electrode.

The insulating layer may cover an edge of the first electrode, and the second electrode may extend over an upper surface of the insulating layer.

In the hole of the insulating layer, a conductive material that is the same as a material of the second electrode may be provided.

The encapsulation member may include an inorganic layer.

The encapsulation member may include a plurality of layers in which an inorganic layer and an organic layer are alternately stacked.

According to one or more embodiments, an organic light-emitting display apparatus includes: a substrate; a first electrode on the substrate; a first insulating layer covering an edge of the first electrode and including an opening exposing a portion of the first electrode and a hole around the first electrode; an intermediate layer on the first electrode and including an emissive layer; a second electrode covering the intermediate layer and the first insulating layer, a portion of the second electrode being in the hole; and an encapsulation member covering the second electrode and filling an inside of the hole, wherein the hole has a lower portion having a first width and an upper portion having a second width less than the first width.

In all directions from a center of the hole, a distance from the center of the hole to a side surface of the lower portion of the hole may be greater than a distance from the center of the hole to a side surface of the upper portion of the hole.

A distance from a side surface of the lower portion of the hole to a side surface of the upper portion of the hole may be less than or equal to 1500 Å.

A height of the lower portion of the hole may be less than a thickness of the first insulating layer.

The encapsulation member may include an inorganic layer.

The encapsulation member may include a plurality of layers in which an inorganic layer and an organic layer are alternately stacked.

The organic light-emitting display apparatus may further include: a pixel circuit electrically connected to the first electrode; and a second insulating layer between the first electrode and the pixel circuit.

According to one or more embodiments, a method of manufacturing an organic light-emitting display apparatus includes: providing a substrate including an emission region and a non-emission region surrounding the emission region; forming a sacrificial layer in the non-emission region of the substrate; forming a first electrode in the emission region of the substrate; forming a first insulating layer covering the sacrificial layer and the first electrode; forming, in the first insulating layer, a first opening exposing a portion of the first electrode and a second opening exposing a portion of the sacrificial layer; forming a hole in a portion of the first insulating layer by removing the sacrificial layer, the portion of the first insulating layer being a portion in which the second opening is formed; forming an emissive layer in the first opening; forming a second electrode on the emissive layer and an upper surface of the first insulating layer; and forming an encapsulation member on an upper surface of the second electrode.

The hole may have a lower portion having a first width and an upper portion having a second width less than the first width.

In all directions from a center of the hole, a distance from the center of the hole to a side surface of the lower portion of the hole may be greater than a distance from the center of the hole to a side surface of the upper portion of the hole.

A distance from a side surface of the lower portion of the hole to a side surface of the upper portion of the hole may be less than or equal to 1500 Å.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the disclosure allows for various changes and numerous embodiments, particular embodiments will be illustrated in the drawings and described in further detail in the written description. Herein, effects and features of the present disclosure and a method for accomplishing them will be described more fully with reference to the accompanying drawings, in which some embodiments of the disclosure are shown. This disclosure may, however, be embodied in many different forms and should not be construed as limited to the embodiments set forth herein.

It is to be understood that, although the terms "first," "second," etc. may be used herein to describe various components, these components should not be limited by these terms. These terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes and thicknesses of elements in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, the terms "correspond" and/or "corresponding" indicate that components are arranged in the same column or row or connected to each other, depending on the context. For example, when a first component is referred to as being connected to a "corresponding" second component among a plurality of second components, the first component may be connected to the second component in the same column or row.

Herein, the present disclosure will be described in further detail by explaining some embodiments of the disclosure with reference to the attached drawings. Like reference numerals in the drawings denote like elements, and, thus, their repeated description may be omitted.

Figure 1:
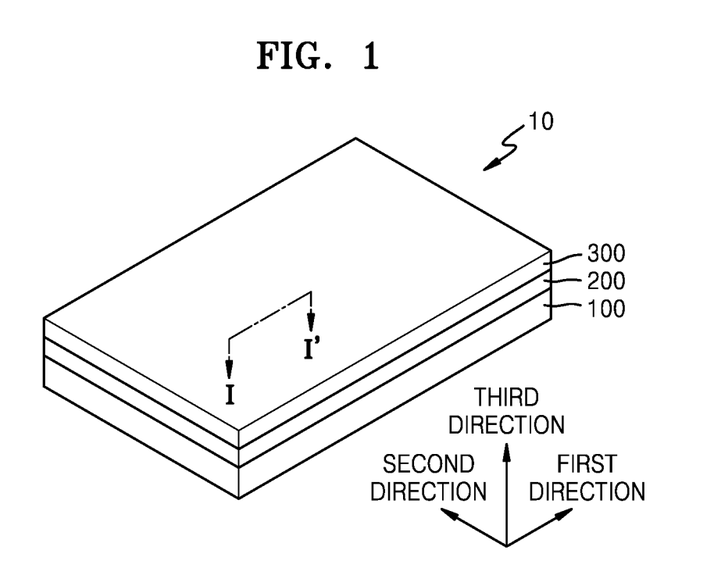
FIG. 1 is a schematic perspective view of a display apparatus according to an embodiment.
Figure 2:
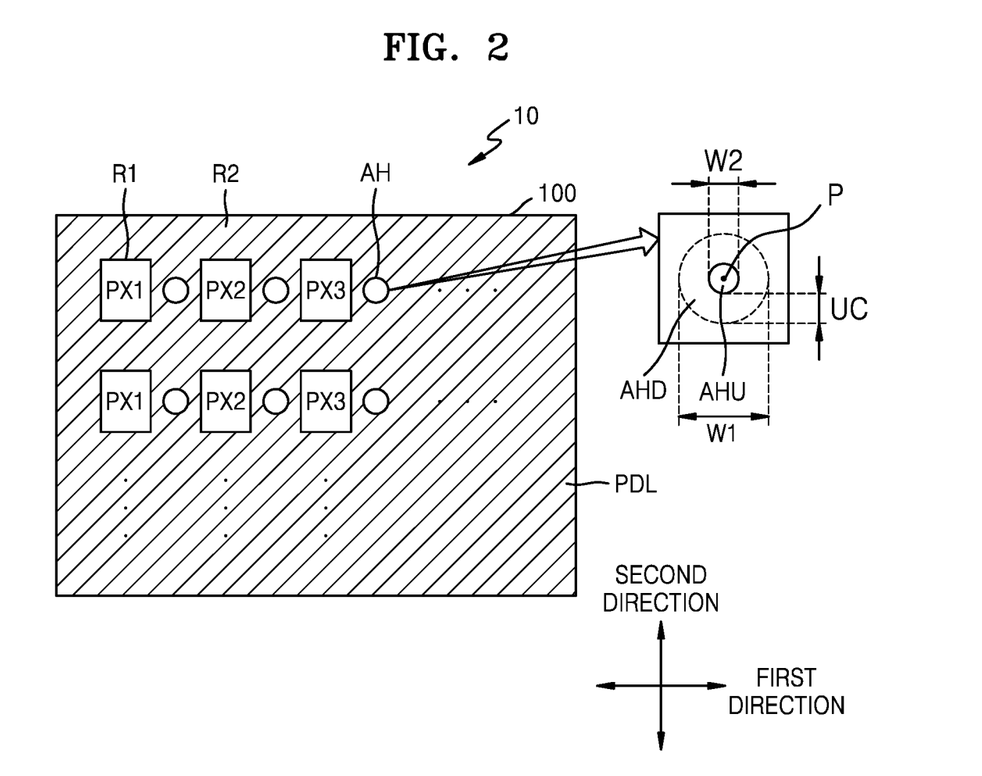
FIGS. 2 and 3 are schematic plan views of the display apparatus according to embodiments.
Figure 3:
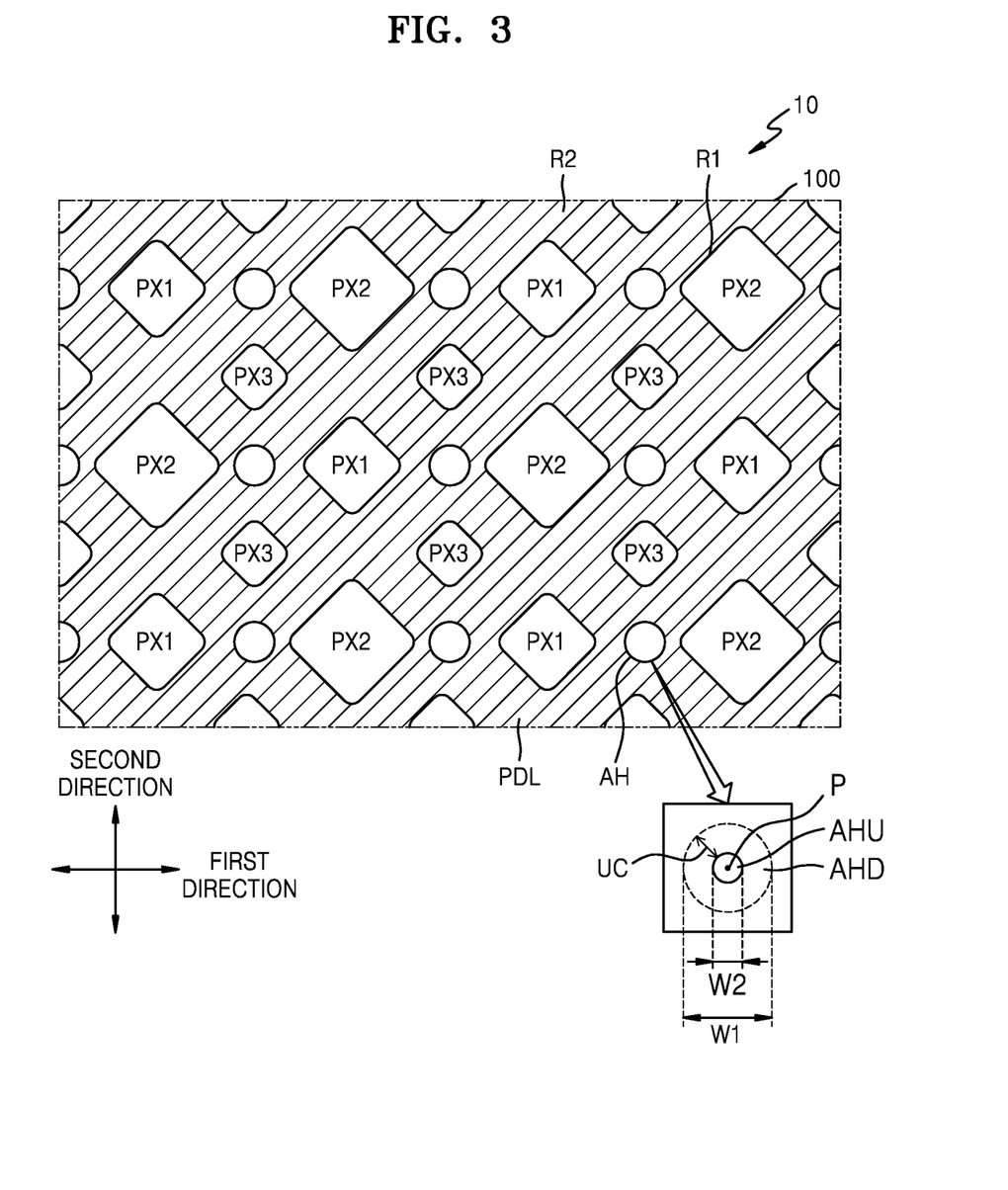
Figure 4:
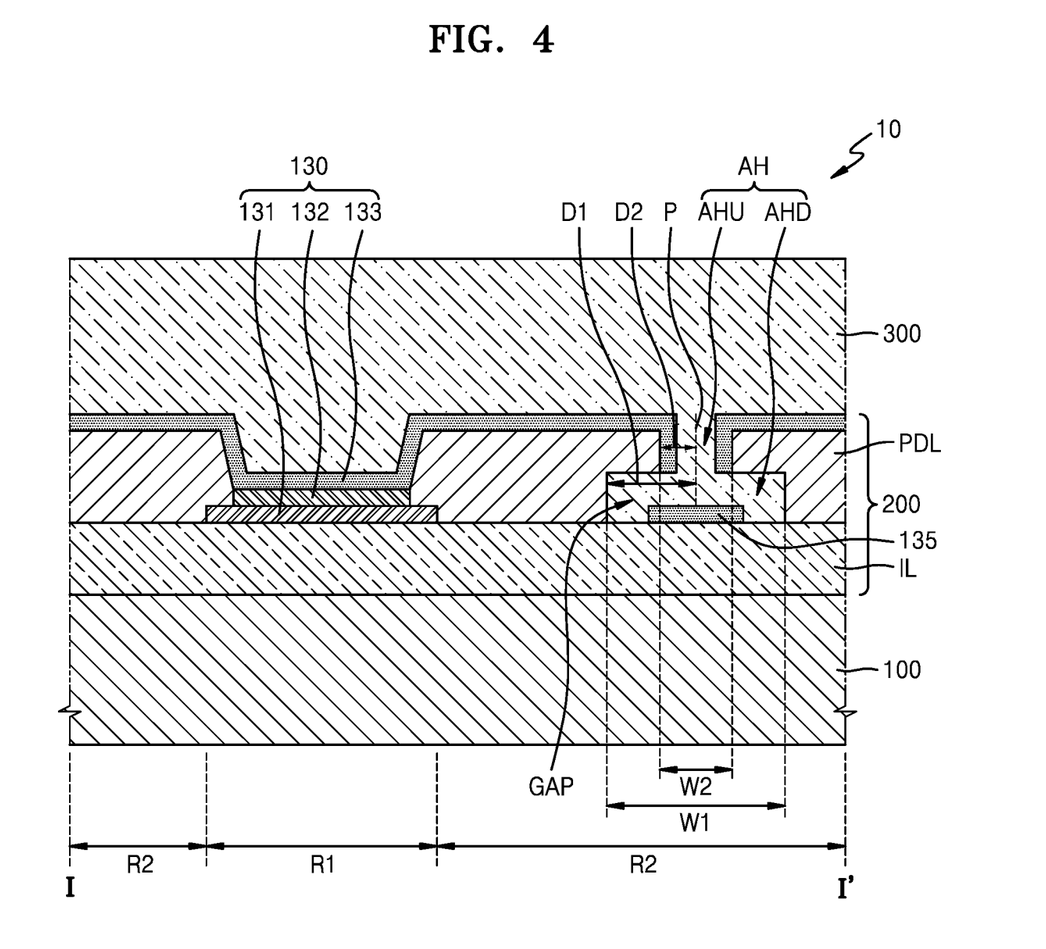
FIG. 4 is a partial cross-sectional view of the display apparatus of FIG. 1, taken along the line I-I' of FIG. 1.

FIG. 1 is a schematic perspective view of a display apparatus 10 according to an embodiment. FIGS. 2 and 3 are schematic plan views of the display apparatus 10 according to embodiments. FIG. 4 is a cross-sectional view of the display apparatus 10 of FIG. 1, taken along the line I-I' of FIG. 1.

Referring to FIGS. 1 to 3, the display apparatus 10 according to an embodiment includes a substrate 100, a display 200 on the substrate 100, and an encapsulation member 300 covering the display 200, which are sequentially stacked in a third direction.

The display apparatus 10 may be a liquid crystal display (LCD), an organic light-emitting display, an electrophoretic display, an electrowetting display panel, or the like. Herein, a case where the display apparatus 10 is an organic light-emitting display apparatus will be described.

The substrate 100 may include an emission region R1 and a non-emission region R2 surrounding the emission region R1.

In the display 200, multiple pixels may be arranged in a first direction (a row direction) and a second direction (a column direction). For example, in the display 200, first pixels PX1, second pixels PX2, and third pixels PX3 may be repeatedly arranged in the first direction and the second direction, in accordance with a certain pattern.

The pixel may include a display device and a pixel circuit electrically connected to the display device. The pixel circuit may include at least one thin film transistor and at least one capacitor. The display device may be an organic light-emitting diode (OLED).

The display device is located in the emission region R1, and the pixel circuit may be located in the emission region R1 and/or the non-emission region R2 surrounding the emission region R1. The emission region R1 may be defined as a region where a first electrode or an emissive layer of the display device is located.

The encapsulation member 300 may include a substrate or at least one thin film stacked on the display 200. In an embodiment, the encapsulation member 300 may include multiple thin films and may prevent or substantially prevent external moisture and/or air from penetrating into the display 200.

The encapsulation member 300 may cover the display 200 and extend towards an outer side thereof. In an embodiment, the encapsulation member 300 may include an inorganic layer including at least one inorganic material and an organic layer including at least one organic material. In some embodiments, the encapsulation member 300 may have a structure in which a first inorganic layer, an organic layer, and a second inorganic layer are stacked.

Although not illustrated, on the encapsulation member 300, various functional layers, e.g., a polarization layer for decreasing reflection of external light, a black matrix, color filters, and/or a touch screen layer including a touch electrode may be disposed. In addition, a window may be coupled to an upper portion of the encapsulation member 300 by using a pressure sensitive adhesive (PSA), for example.

In an embodiment, as shown in FIG. 2, the emission regions R1 may be arranged in lines in a stripe pattern in the first direction and the second direction. In each row, the first pixel PX1, the second pixel PX2, and the third pixel PX3 may be alternately arranged in the emission region R1 in the first direction. In the second direction, the first pixels PX1 may be arranged in a first column, the second pixels PX2 may be arranged in a second column adjacent to the first column, and the third pixels PX3 may be arranged in a third column adjacent to the second column.

In an embodiment, as shown in FIG. 3, the emission regions R1 may be arranged in lines in a zigzag pattern in the first direction and in a stripe pattern in the second direction. In each row, the first pixel PX1, the third pixel PX3, the second pixel PX2, and the third pixel PX3 may be alternately arranged in the emission region R1 in a zigzag pattern in the first direction. In the second direction, the first pixels PX1 and the second pixels PX2 may be alternately arranged in a first column, the third pixels PX3 may be arranged in a second column adjacent to the first column, and the first pixels PX1 and the second pixels PX2 may be alternately arranged in a third column adjacent to the second column. The arrangements of the first pixels PX1 and the second pixels PX2 in the first column may be opposite to the arrangements of the first pixels PX1 and the second pixels PX2 in the third column.

In the embodiments shown in FIGS. 2 and 3, the emission region R1 may be square-shaped. However, embodiments are not limited thereto. The emission region R1 may have any of various shapes, such as a polygon, a rectangle, a circle, a circular cone, an oval, and a triangle.

In the non-emission region R2, an insulating layer surrounding the emission region R1 and functioning as a pixel-defining layer may be disposed, and in the insulating layer, holes AH may be formed at regular intervals.

Referring to FIG. 4, the display apparatus 10 may include the display 200, which is disposed on the substrate 100 and includes the pixels thereon, and the encapsulation member 300 on the display 200.

The pixel may include a display device 130 in the emission region R1. At least one insulating layer IL may be disposed between the substrate 100 and the display device 130.

The display device 130 may include a first electrode 131, a second electrode 133 facing the first electrode 131, and an intermediate layer 132 between the first electrode 131 and the second electrode 133. Although not illustrated, the first electrode 131 may be electrically connected to the pixel circuit thereunder.

In the non-emission region R2, a pixel-defining layer PDL including the hole AH may be disposed.

The hole AH in the pixel-defining layer PDL may be disposed in a vicinity of the display device 130 and may have a structure that includes a lower portion AHD having a first width W1 and an upper portion AHU having a second width W2 less than the first width W1. A distance D1 from a center P of the hole AH to a side surface of the lower portion AHD of the hole AH is greater than a distance D2 from the center P of the hole AH to a side surface of the upper portion AHU of the hole AH. That is, a lower cross-section of the hole AH may be larger and wider than an upper cross-section thereof.

In other words, as a lower portion of the pixel-defining layer PDL is removed more than an upper portion thereof, the pixel-defining layer PDL may have an undercut structure in which gaps GAP are formed between the upper portion of the pixel-defining layer PDL and the insulating layer IL in all directions from the center P of the hole AH as seen in a plane.

Here, the term "undercut" denotes a shape in which, when a layer is etched, side surfaces of the layer are overly etched such that an upper area of the layer is narrower than a lower area thereof.

In the hole AH, a conductive material 135 that is a same as a material of the second electrode 133 of the display device 130 may be provided. The conductive material 135 may be part of the second electrode 133 that remains in the hole AH when the second electrode 133 of the display device 130 extends over an upper surface of the pixel-defining layer PDL.

The encapsulation member 300 may cover an upper surface of the second electrode 133 and the hole AH. Accordingly, the encapsulation member 300 may fill the inside of the hole AH. The encapsulation member 300 may cover the conductive material 135 in the hole AH.

The hole AH may have a circular shape in one or more embodiments, but embodiments are not limited thereto. The hole AH may have any of various shapes, such as a polygon, a square, an oval, and a triangle.

FIGS. 5 to 15 are schematic cross-sectional views of processes of manufacturing a display apparatus, according to an embodiment.

Figure 5:
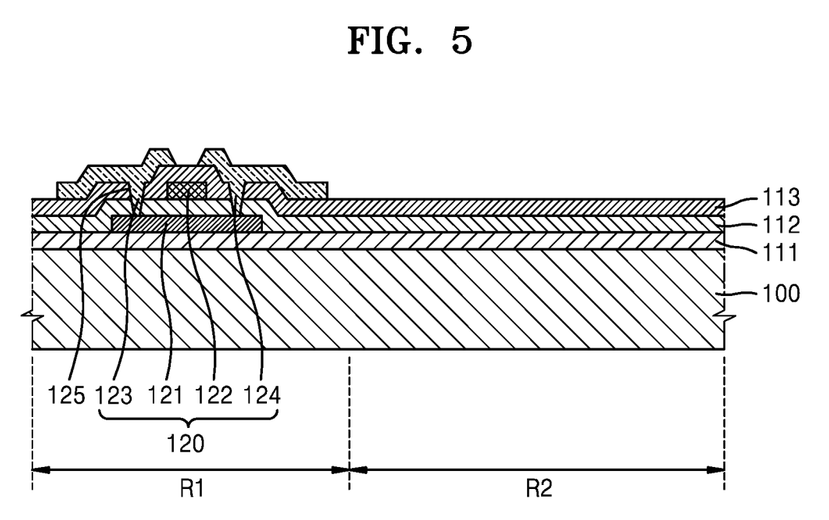
FIGS. 5 to 15 are schematic cross-sectional views of a process of manufacturing a display apparatus, according to an embodiment.

Referring to FIG. 5, a buffer layer 111 is on the substrate 100, and an active layer 121 of a thin film transistor 120 may be formed by forming a semiconductor layer on the buffer layer 111 and patterning the semiconductor layer.

The substrate 100 may include a glass material, a ceramic material, a metallic material, a plastic material, a flexible material, or a bendable material. For example, the substrate 100 may have good durability and heat resistance and may include any of materials, such as polyethylene terephthalate (PET), polyethylene naphthalate (PEN), polycarbonate, polyarylate, polyether imide, polyether sulfone, and polyimide, which enable bending of the substrate 100. However, embodiments are not limited thereto. The substrate 100 may include any of various flexible materials.

The substrate 100 may have a single-layer structure or a multilayered structure including any of the above materials, and when the substrate 100 has a multilayered structure, an inorganic layer may be further included. In some embodiments, the substrate 100 may have a structure including an organic material/an inorganic material/an organic material.

The buffer layer 111 may include at least one of an inorganic layer and an organic layer. For example, the buffer layer 111 may prevent or substantially prevent penetration of impurities into the substrate 100, may flatten a surface of the substrate 100, and may be a layer or layers including inorganic materials, such as silicon nitride (SiNx) and/or silicon oxide (SiOx). In an embodiment, the buffer layer 111 may not be formed.

The semiconductor layer may include any of various materials. For example, the semiconductor layer may include an inorganic semiconductor material, such as amorphous silicon or polycrystalline silicon. As another example, the semiconductor layer may include an oxide semiconductor or an organic semiconductor material.

A first insulating layer 112 is formed on the active layer 121, and a gate electrode 122 may be formed by forming a first conductive layer on the first insulating layer 112 and patterning the first conductive layer.

The first insulating layer 112 may be an inorganic insulating layer. The first insulating layer 112 may be an insulating layer or insulating layers including at least one of silicon dioxide ($SiO_2$), SiNx, silicon oxynitride (SiON), aluminum oxide ($Al_2O_3$), titanium oxide ($TiO_2$), tantalum pentoxide ($Ta_2O_5$), hafnium dioxide ($HfO_2$), zirconium dioxide ($ZrO_2$), barium strontium titanate (BST), and lead zirconate titanate (PZT).

The first conductive layer may include any of various conductive materials. For example, the first conductive layer may be a layer or layers including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

By forming a second insulating layer 113 on the gate electrode 122 and patterning the second insulating layer 113, a contact hole 125 exposing part of a source area and a drain area of the active layer 121 may be formed.

The second insulating layer 113 may be an inorganic insulating layer. In an embodiment, the second insulating layer 113 may be an insulating layer or insulating layers including at least one of $SiO_2$, $SiN_x$, SiON, $Al_2O_3$, $TiO_2$, $Ta_2O_5$, $HfO_2$, $ZrO_2$, BST, and PZT. In other embodiments, the second insulating layer 113 may be an organic insulating layer.

After a second conductive layer is formed on the second insulating layer 113 and then patterned, a source electrode 123 and a drain electrode 124 respectively contacting the source area and the drain area of the active layer 121 may be formed.

In an embodiment, the second conductive layer may be a layer or layers including the same material as the first conductive layer.

Figure 6:
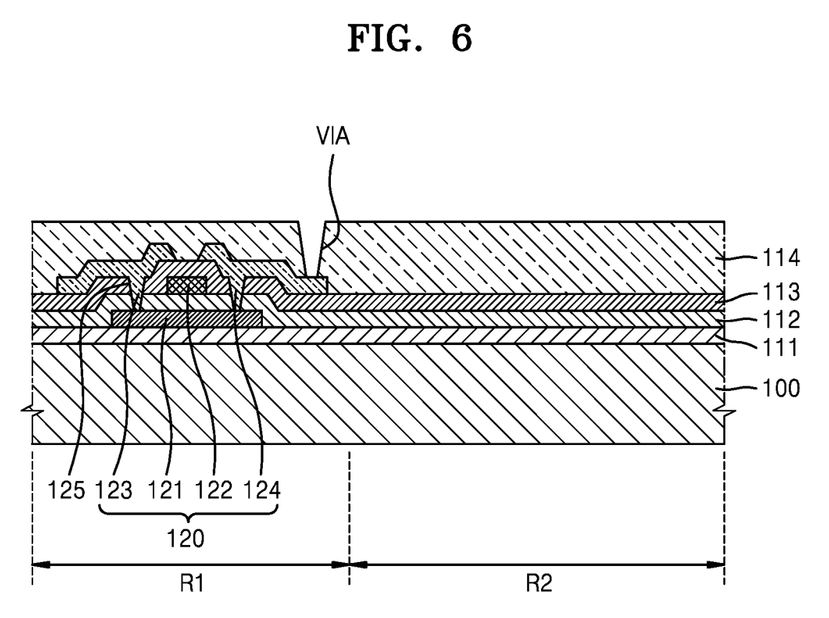

Referring to FIG. 6, after a third insulating layer 114 is formed on the source electrode 123 and the drain electrode 124 and then is patterned, a via hole VIA exposing part of one of the source electrode 123 and the drain electrode 124 (a drain electrode of FIG. 6) may be formed.

The third insulating layer 114 may be an organic insulating layer or organic insulating layers. The third insulating layer 114 may include a general-use polymer (e.g., poly (methyl methacrylate) (PMMA) or polystyrene (PS)), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, or a blend thereof. For example, the third insulating layer 114 may include polyimide, poly amide, acryl resin, or the like.

Figure 7:
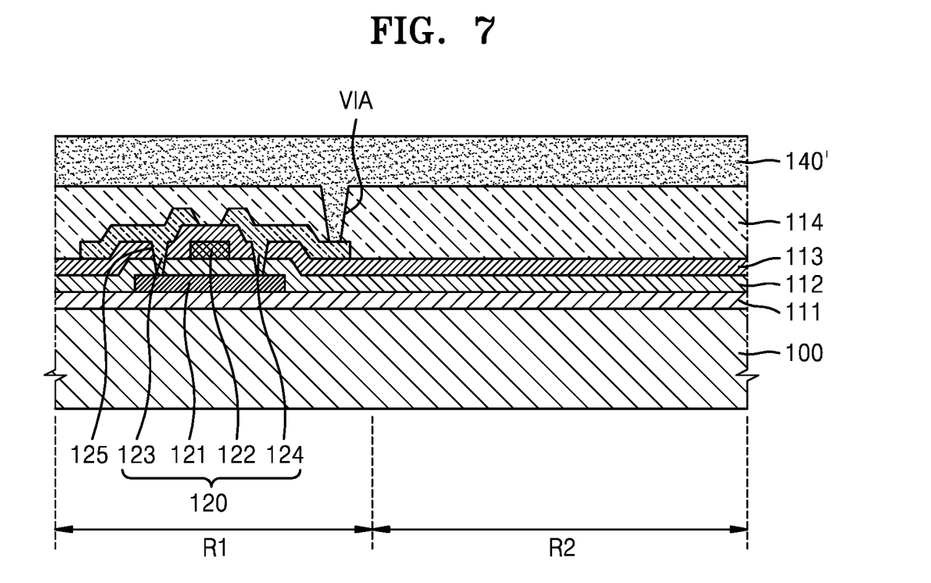

Referring to FIG. 7, a sacrificial layer 140' may be formed above the substrate 100 and above the third insulating layer 114.

In an embodiment, the sacrificial layer 140' may be a layer or layers including a metal that is selectively etched with a material forming the first electrode 131 to be formed later.

In other embodiments, the sacrificial layer 140' may be a layer or layers including inorganic materials, such as SiNx and/or SiOx.

Figure 8:
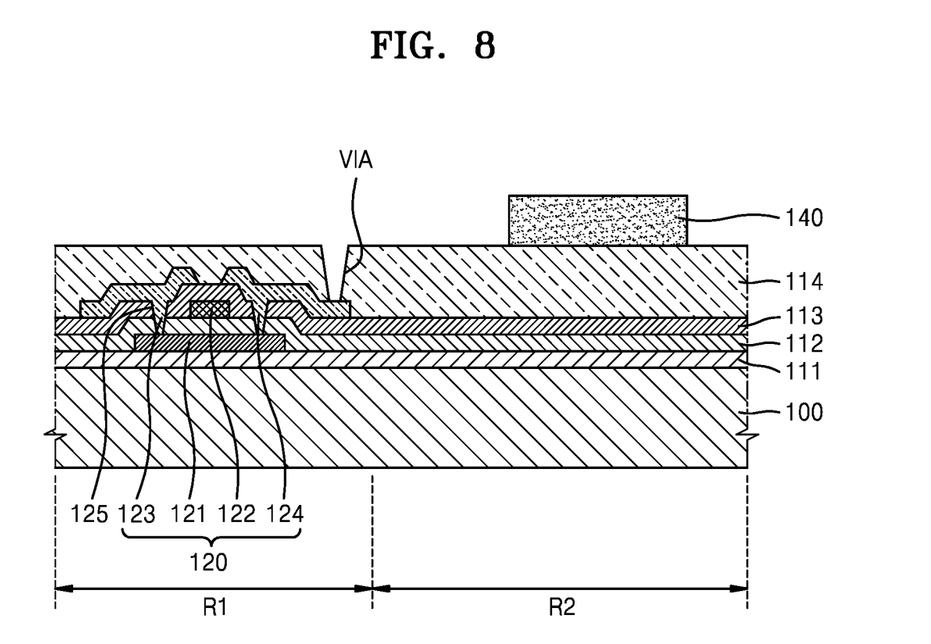

Referring to FIG. 8, the sacrificial layer 140' is patterned to form a sacrificial pattern 140 on the third insulating layer 114 in the non-emission region R2.

After photoresist is formed on the sacrificial layer 140', exposing and developing processes are performed using a mask so as to form a photoresist pattern in the non-emission region R2. As the sacrificial layer 140' is etched by using the photoresist pattern as the mask, the sacrificial pattern 140 may be formed on the third insulating layer 114 in the non-emission region R2.

A thickness of the sacrificial pattern 140 may be less than or equal to that of a fourth insulating layer 115.

Figure 9:
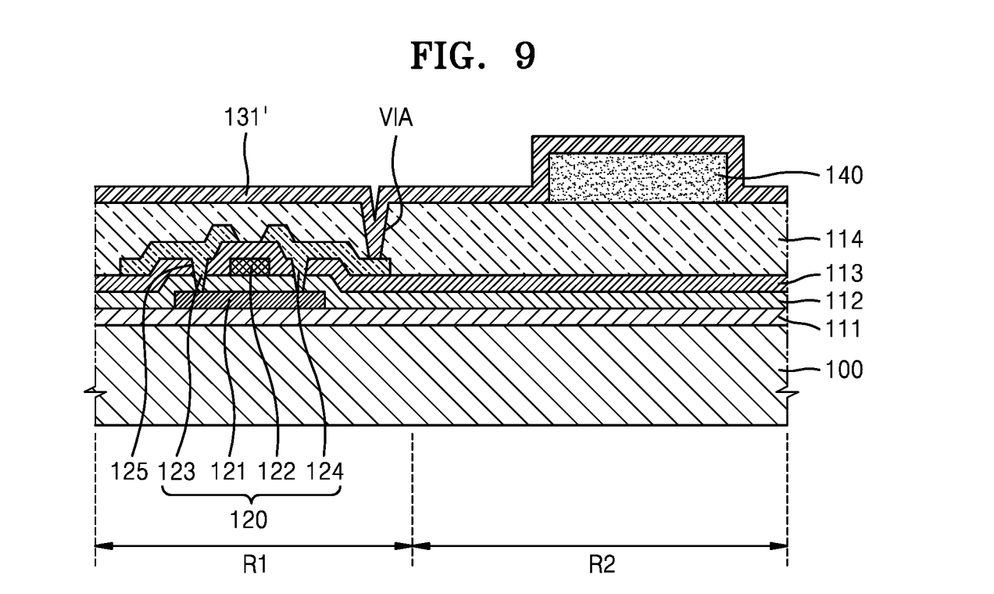

Referring to FIG. 9, a third conductive layer 131' may be formed above the substrate 100 and above the sacrificial pattern 140. The third conductive layer 131' may cover upper surfaces of the third insulating layer 114 and the sacrificial pattern 140.

The third conductive layer 131' may include a reflective layer including Ag, Mg, Al, Pt, Pd, Au, Ni, Nd, Ir, Cr, or a compound thereof, and a transparent or translucent electrode layer formed on the reflective layer.

Figure 10:
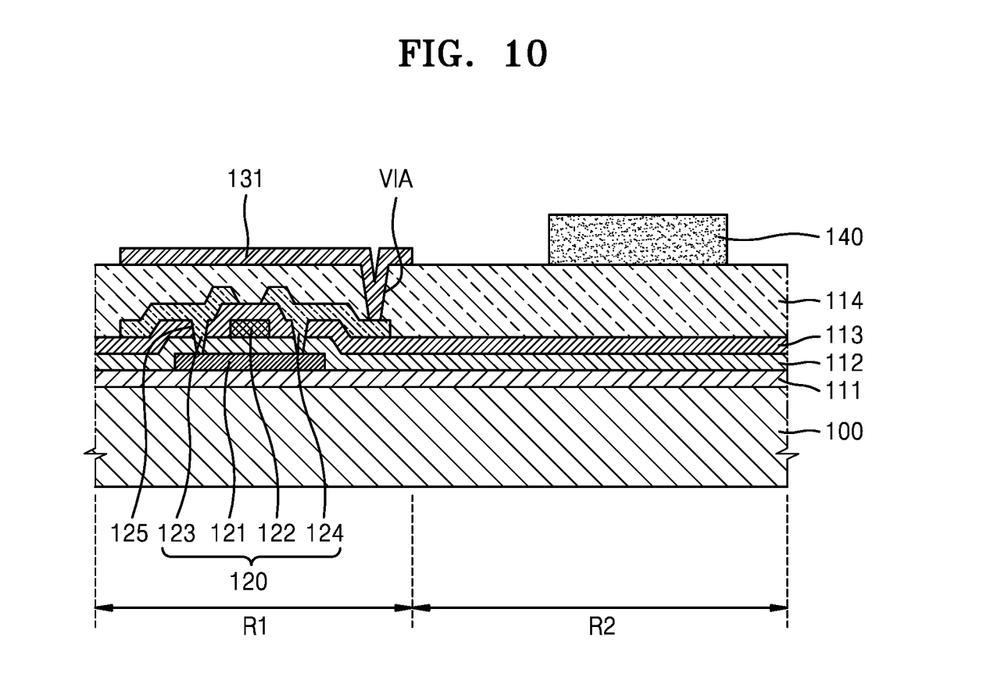

Referring to FIG. 10, the first electrode 131 is formed by patterning the third conductive layer 131', and the first electrode 131 may be electrically connected to one of the source electrode 123 and the drain electrode 124 (a drain electrode of FIG. 10) through the via hole VIA.

In an embodiment, the first electrode 131 is formed after the sacrificial pattern 140 is formed. However, in an embodiment, the first electrode 131 is formed first, and then the sacrificial pattern 140 is formed. When the first electrode 131 is formed after forming the sacrificial pattern 140, the first electrode 131 may be prevented from being damaged while the sacrificial pattern 140 is formed.

Figure 11:
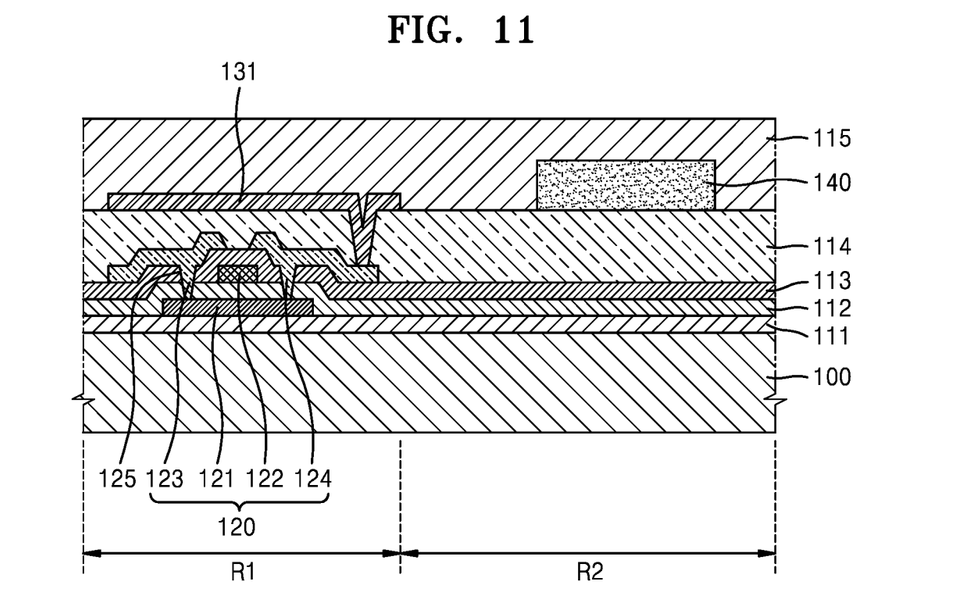

Referring to FIG. 11, the fourth insulating layer 115 may be formed above the substrate 100 and above the first electrode 131.

The fourth insulating layer 115 may be an inorganic or organic insulating layer or inorganic or organic insulating layers.

Figure 12:
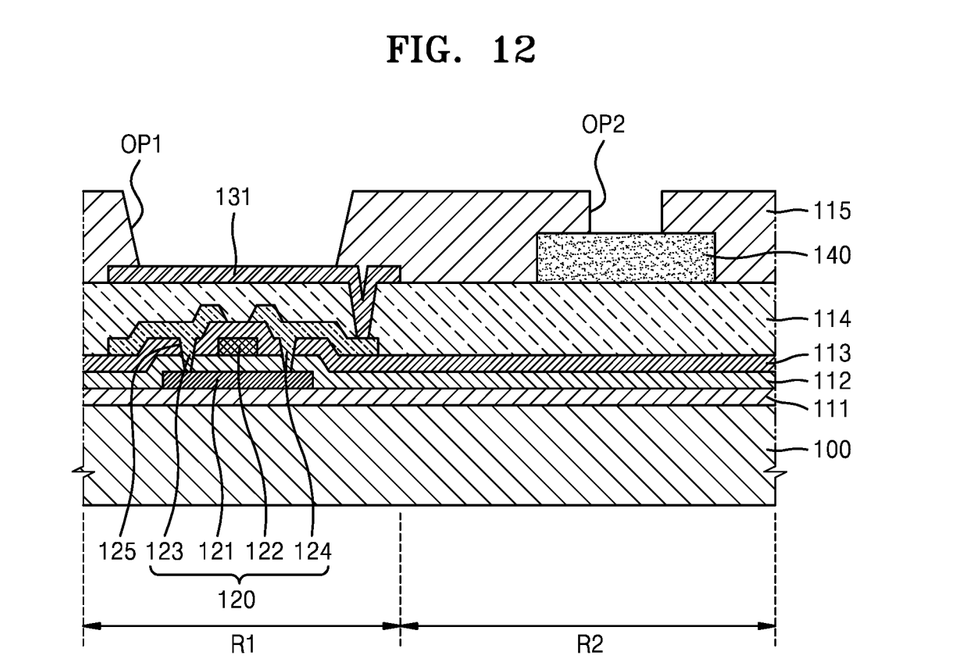

Referring to FIG. 12, the fourth insulating layer 115 may be patterned to form a first opening OP1 exposing at least a portion of the first electrode 131, and a second opening OP2 exposing at least a portion of the sacrificial pattern 140.

The fourth insulating layer 115 may cover an edge of the first electrode 131 and an edge of the sacrificial pattern 140.

Figure 13:
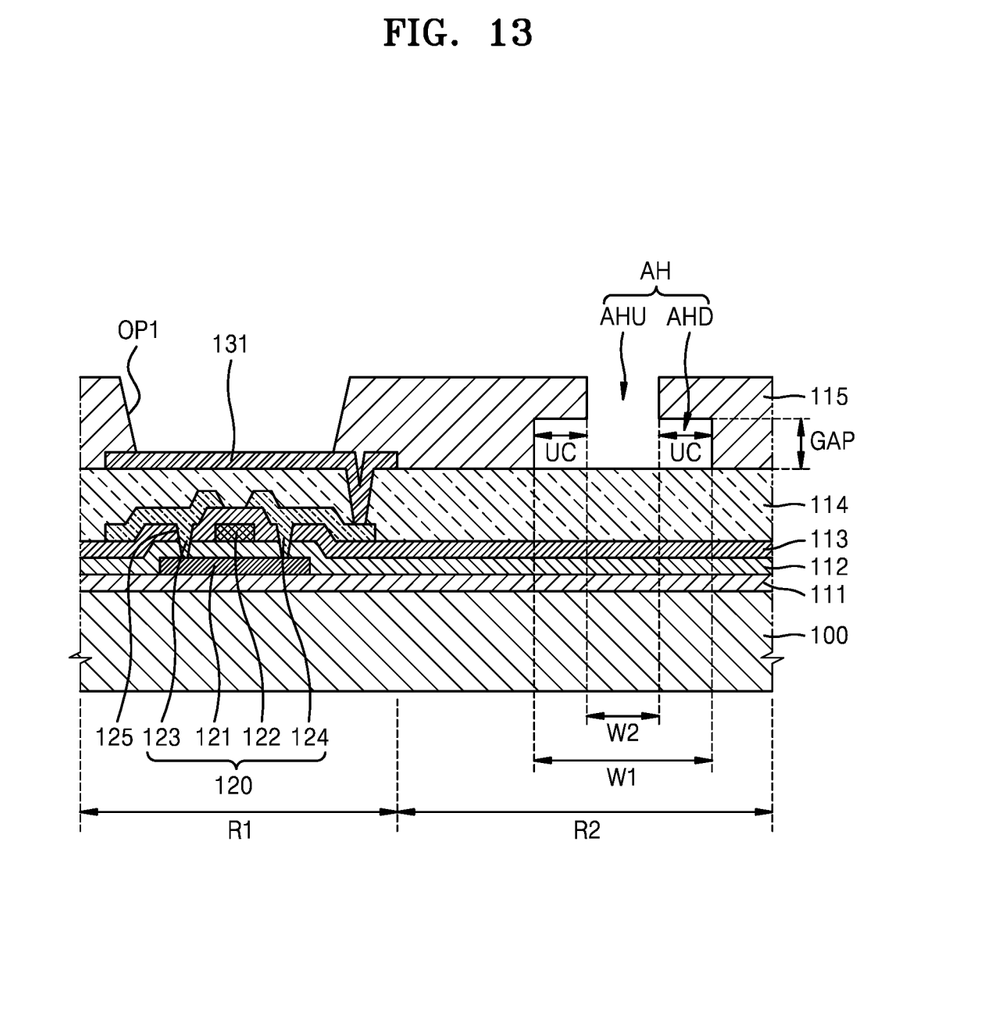

Referring to FIG. 13, the hole AH may be formed in the fourth insulating layer 115 by removing the sacrificial pattern 140 in the fourth insulating layer 115.

The sacrificial pattern 140 may be removed through etching. An etching method may be wet etching using an etchant or dry etching using plasma or a laser. However, the etching method is not limited thereto. As a material that does not damage the first electrode 131 is used as the etchant, device characteristics of a display device may not be affected.

Through isotropic etching, an undercut UC may be formed in a lower portion of the fourth insulating layer 115. That is, through isotropic etching, the lower portion AHD of the hole AH is convex towards the fourth insulating layer 115 in all directions. Accordingly, the hole AH may have the lower portion AHD having the first width W1 and the upper portion AHU having the second width W2. The lower portion AHD is formed in the lower portion of the fourth insulating layer 115, and the upper portion AHU is formed in an upper portion thereof. A gap GAP may be formed between the upper portion of the fourth insulating layer 115 and the third insulating layer 114 due to the lower portion AHD.

A length of the undercut UC formed in the lower portion of the fourth insulating layer 115 may be limited to a length at which the fourth insulating layer 115, which is formed at the top of the lower portion AHD of the hole AH, does not collapse and an interfacial release force between the display device 130 and the encapsulation member 300 increases. For example, the length of the undercut UC may be less than or equal to about 15,000 Å. In an embodiment, the length of the undercut UC may be between about 3,000 Å and about 15,000 Å.

Figure 14:
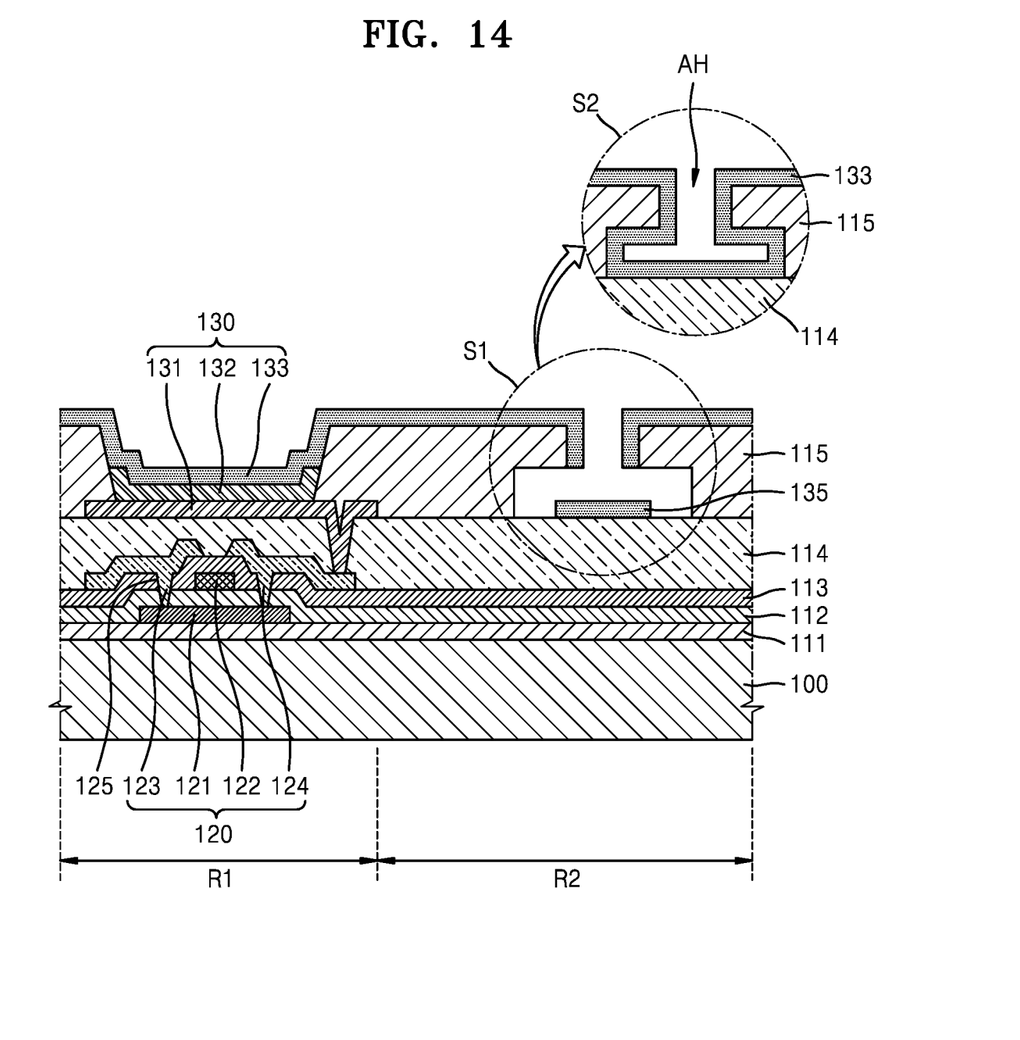

Referring to FIG. 14, the intermediate layer 132 may be formed in the first opening OP1 exposing the first electrode 131, and the second electrode 133 facing the first electrode 131 may be formed on the intermediate layer 132.

The intermediate layer 132 may include at least an emissive layer (EML) and may further include at least one functional layer selected from among a hole injection layer (HIL), a hole transport layer (HTL), an electron transport layer (ETL), and an electron injection layer (EIL).

The EML may be a red EML, a green EML, or a blue EML. Alternatively, the EML may have a structure in which a red EML, a green EML, and a blue EML are stacked or a single layer structure including a red emissive material, a green emissive material, and a blue emissive material so as to emit white light.

FIG. 14 illustrates that the intermediate layer 132 is patterned corresponding to only the first electrode 131 for convenience. However, the intermediate layer 132 may be integrally formed with the intermediate layer 132 of the display device 130 in an adjacent emission region R1. In addition, at least one layer of the intermediate layer 132 may be respectively formed in the emission regions R1, and other layers of the intermediate layer 132 may be integrally formed with the intermediate layer 132 in the adjacent emission regions R1.

The second electrode 133 may include a layer including Li, Ca, lithium fluoride (LiF)/Ca, LiF/Al, Al, Mg, and/or a compound thereof, and an auxiliary electrode or a bus electrode line formed on the layer and including a material, e.g., indium tin oxide (ITO), indium zinc oxide (IZO), zinc oxide (ZnO), indium oxide ($In_2O_3$), etc., which is used to form a transparent electrode.

In an embodiment, the second electrode 133 may be formed on the entire substrate 100 including the emission regions R1 and the non-emission region R2. The second electrode 133 may be cut within the hole AH due to the undercut structure of the hole AH. The conductive material 135, which is part of the second electrode 133 cut by the hole AH, may remain at the bottom of the hole AH (see region "S1"). In other words, the conductive material 135 may contact the upper surface of the third insulating layer 114 within the hole AH.

In other embodiments, the second electrode 133 may not be cut by the hole AH and may be formed along the side surfaces of the hole AH (see region "S2").

Figure 15:
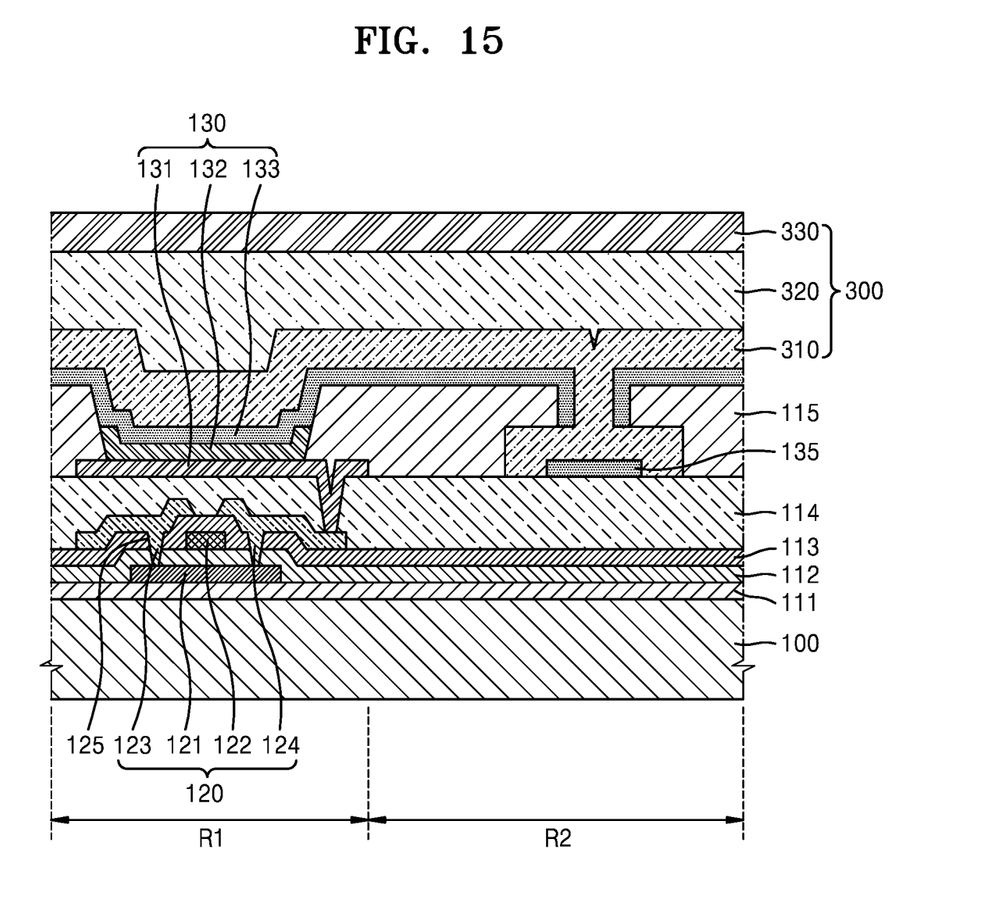

Referring to FIG. 15, the encapsulation member 300 may be formed above the substrate 100 and above the second electrode 133.

In an embodiment, the encapsulation member 300 may include a first barrier layer 310, an organic material layer 320, and a second barrier layer 330.

The first barrier layer 310 may be a layer or layers including any of SiNx, $SiO_2$, SiON, a metal, or a metal oxide including aluminum oxide ($Al_2O_3$), aluminum oxynitride (AlON), magnesium oxide (MgO), ZnO, $HfO_2$, or $ZrO_2$, or at least two combinations thereof.

The organic material layer 320 may be an organic layer or organic layers including any of a general-use polymer (e.g., PMMA or PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The second barrier layer 330 may be a layer or layers including any of SiNx, $SiO_2$, SiON, a metal, or a metal oxide including $Al_2O_3$, AlON, MgO, ZnO, $HfO_2$, or $ZrO_2$, or at least two combinations thereof.

The first barrier layer 310, the organic material layer 320, and the second barrier layer 330 may be formed by using any of sputtering, thermal evaporation, chemical vapor deposition (CVD), plasma enhanced chemical vapor deposition (PECVD), ion beam assisted deposition (IBAD), and atomic layer deposition (ALD).

The encapsulation member 300 may be easily released because of weak adhesion to a surface that is mostly flat around the display device 130. For example, a protection film is attached to the upper surface of the encapsulation member 300 so as to perform a cutting process after the encapsulation member 300 is formed. Then, while the protection film is removed after the cutting process, the encapsulation member 300 may be released from an interface between the encapsulation member 300 and the display 200. The occurrence of the release may affect a lifetime of the display apparatus.

Also, while a flexible display apparatus such as a rollable display apparatus is folded, the encapsulation member 300 may be released from the interface between the encapsulation member 300 and the display 200.

In an embodiment, in order to decrease the occurrence of release from the interface between the encapsulation member 300 and the display device 130, a release barrier structure (a peel-preventing structure) capable of increasing a release path may be formed in the non-emission region of the display. In an embodiment, the release barrier structure is a hole pattern which is an undercut structure formed in the pixel-defining layer that is an uppermost insulating layer of the display. Due to the release barrier structure, release force may be increased or improved.

Figure 16:
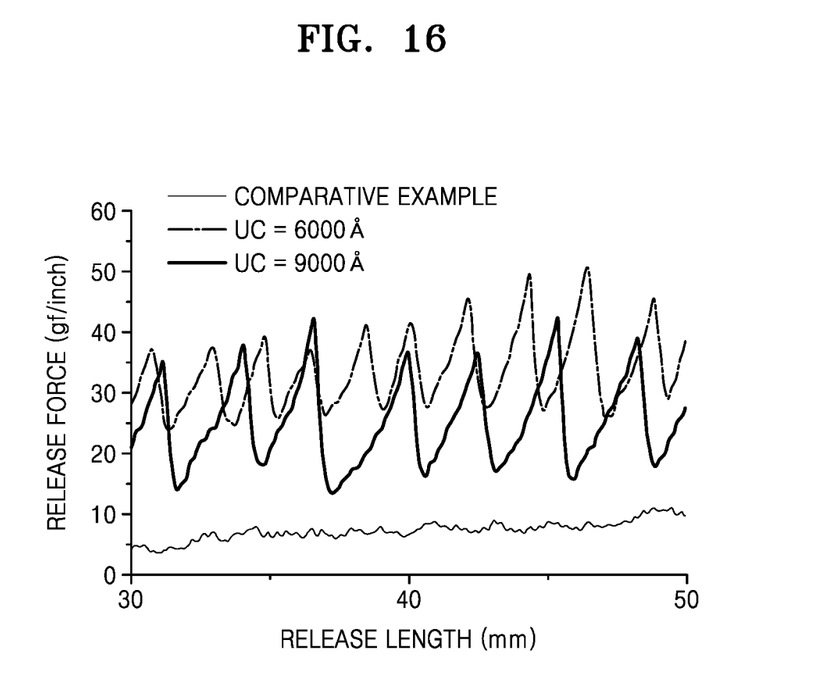
FIG. 16 is a graph showing a result of testing a release force of a display apparatus, according to an embodiment.

FIG. 16 is a graph showing a result of testing a release force of a display apparatus, according to an embodiment.

FIG. 16 shows results of testing release force per release length in each of a comparative example with no release barrier structure, a first embodiment, in which the undercut length is 6000 Å, and a second embodiment, in which the undercut length is 9000 Å.

Referring to FIG. 16, compared to a release force (5 gf/inch) of the comparative example, the release forces (20 to 50 gf/inch) of the first and second embodiments are increased.

Figure 17:
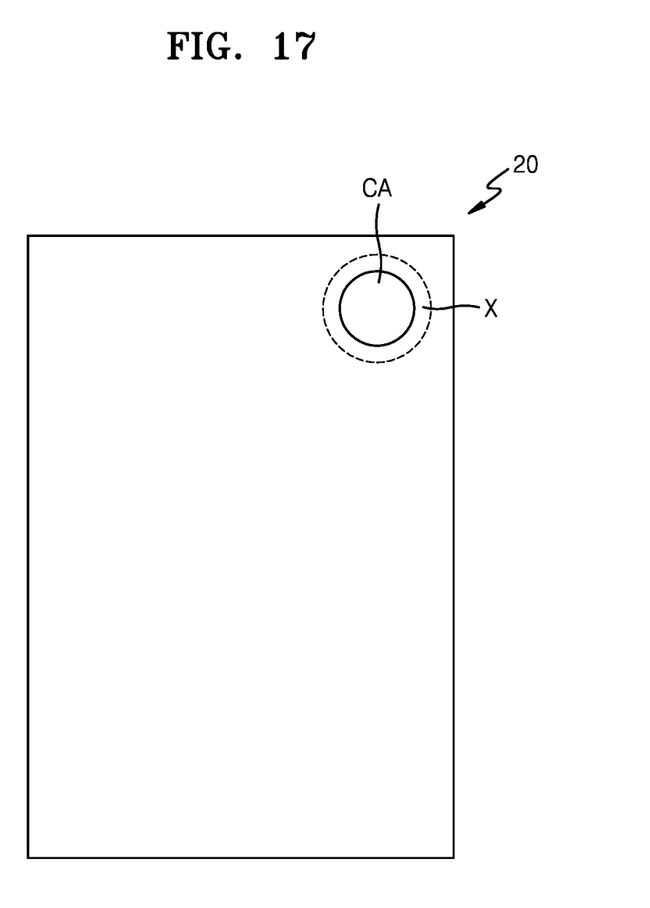
FIGS. 17 and 18 illustrate other examples of display apparatuses to which release barrier structures are applied, according to embodiments.
Figure 18:
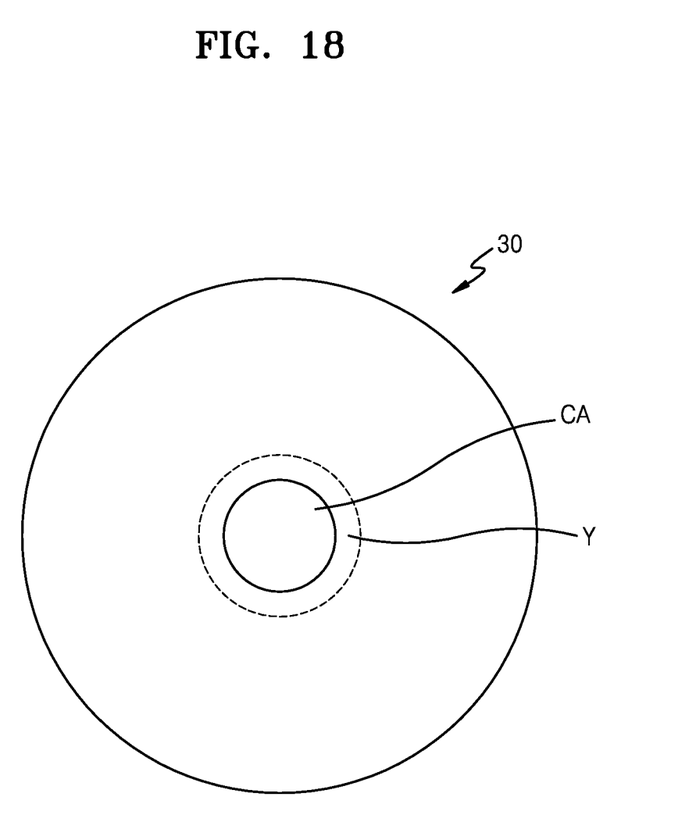

FIGS. 17 and 18 illustrate other examples of display apparatuses 20 and 30 to which release barrier structures are applied, according to embodiments.

When cutting areas CA such as grooves are provided in the display apparatus 20 of FIG. 17 and a circular display apparatus 30 of FIG. 18, release may be highly likely to occur in a vicinity of the cutting areas CA. Therefore, as the release barrier structures according to embodiments are formed at regular intervals in the pixel-defining layer in non-emission regions of peripheral areas X and Y near the cutting areas CA, a release possibility may be reduced.

As the release barrier structures according to an embodiment are formed in an insulating layer (e.g., a pixel-defining layer) located in a non-emission region of a display regardless of a shape of a display apparatus, the occurrence of release of an encapsulation member decreases while a protection film is removed or a flexible display apparatus is folded, and, thus, a production yield of a display apparatus may be improved by increasing adhesion of the encapsulation member.

The display apparatus according to one or more embodiments may prevent or substantially prevent the occurrence of the release of the encapsulation member from the interface between the encapsulation member and the display, and, thus, the production yield of the display apparatus may be increased. However, the scope of the present disclosure is not limited by the above-described effect.

It is to be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as set forth by the following claims.

What is claimed is:

1. A display comprising:
   a substrate comprising an emission region and a non-emission region surrounding the emission region;
   a display device in the emission region of the substrate;
   an insulating layer in the non-emission region and including a hole having a lower portion having a first width and an upper portion having a second width less than the first width; and
   an encapsulation member covering the display device and the insulating layer and filling an inside of the hole,
   wherein the display device comprises:
   a first electrode;
   a second electrode facing the first electrode; and
   an emissive layer between the first electrode and the second electrode, and
   wherein, in a plan view, the emissive layer is spaced apart from a region of the insulating layer in which the hole is defined.

2. The display of claim 1, wherein, in all directions from a center of the hole, a distance from the center of the hole to a side surface of the lower portion of the hole is greater than a distance from the center of the hole to a side surface of the upper portion of the hole.

3. The display of claim 1, wherein a distance from a side surface of the lower portion of the hole to a side surface of the upper portion of the hole is less than or equal to 1500 Å.

4. The display of claim 1, wherein a height of the lower portion of the hole is less than a thickness of the insulating layer.

5. The display of claim 1, wherein the insulating layer covers an edge of the first electrode, and
   the second electrode extends over an upper surface of the insulating layer.

6. The display of claim 1, wherein, in the hole of the insulating layer, a conductive material that is the same as a material of the second electrode is provided.

7. The display of claim 1, wherein the encapsulation member comprises an inorganic layer.

8. The display of claim 1, wherein the encapsulation member comprises a plurality of layers in which an inorganic layer and an organic layer are alternately stacked.

9. A display comprising:
   a substrate;
   a first electrode on the substrate;
   a first insulating layer covering an edge of the first electrode and comprising an opening exposing a portion of the first electrode and a hole around the first electrode;
   an intermediate layer disposed on the first electrode and comprising an emissive layer;
   a second electrode covering the intermediate layer and the first insulating layer, a portion of the second electrode being disposed in the hole; and
   an encapsulation member covering the second electrode and filling an inside of the hole,
   wherein the hole has a lower portion having a first width and an upper portion having a second width less than the first width, and
   wherein, in a plan view, the emissive layer is spaced apart from a region of the first insulating layer in which the hole is defined.

10. The display of claim 9, wherein, in all directions from a center of the hole, a distance from the center of the hole to a side surface of the lower portion of the hole is greater than a distance from the center of the hole to a side surface of the upper portion of the hole.

11. The display of claim 9, wherein a distance from a side surface of the lower portion of the hole to a side surface of the upper portion of the hole is less than or equal to 1500 Å.

12. The display of claim 9, wherein a height of the lower portion of the hole is less than a thickness of the first insulating layer.

13. The display of claim 9, wherein the encapsulation member comprises an inorganic layer.

14. The display of claim 9, wherein the encapsulation member comprises a plurality of layers in which an inorganic layer and an organic layer are alternately stacked.

15. The display of claim 9, further comprising:
   a pixel circuit electrically connected to the first electrode; and
   a second insulating layer between the first electrode and the pixel circuit.

* * * * *